United States Patent [19]
Olson et al.

[11] Patent Number: 5,358,926
[45] Date of Patent: Oct. 25, 1994

[54] EPITAXIAL THIN SUPERCONDUCTING THALLIUM-BASED COPPER OXIDE LAYERS

[75] Inventors: William L. Olson, Solvang; Michael M. Eddy, Goleta; Robert B. Hammond, Santa Barbara; Timothy W. James, Goleta; McDonald Robinson, Santa Barbara, all of Calif.

[73] Assignee: Superconductor Technologies Inc., Santa Barbara, Calif.

[21] Appl. No.: 98,838

[22] Filed: Jul. 29, 1993

Related U.S. Application Data

[63] Continuation of Ser. No. 852,352, Mar. 17, 1992, abandoned, which is a continuation of Ser. No. 712,147, Jun. 6, 1991, abandoned, which is a continuation of Ser. No. 238,919, Aug. 31, 1988, Pat. No. 5,071,830.

[51] Int. Cl.$^5$ ............................................. H01L 39/00
[52] U.S. Cl. ................................... 505/210; 505/701; 505/702; 505/238; 428/930; 428/702; 257/728; 333/99 S; 343/700 MS File; 427/62
[58] Field of Search ................... 505/1, 701, 702, 783; 427/62, 63, 126.3; 428/930, 702; 257/728; 333/99 S; 343/700 MS File

[56] References Cited

PUBLICATIONS

Chen et al, "Superlattice Modulation and Epitaxy of Thallium Barium Calcium Copper Oxide ($Tl_2Ba_2Ca_2Cu_3O_{10}$) Thin Films Grown on Magnesium Oxide and Strontium Titanate Substrates", Appl. Phys. Lett., 54(16) 1989 pp. 1579–1581.

Brice, "Crystal Growth Processes", pp. 213–214, John Wiley and Sons, New York, 1986.

Liu et al, "Epitaxial Growth of High–Tc Superconducting Thallium Calcium Barium Copper Oxide films by Liquid Phase Epitaxial Process", Physica C, 156(5) pp. 785–787, Dec. 1988.

Ginley et al, "Superconducting Thin Films of Thallium Calcium Barium Copper Oxide ($Tl_2Ca_2Ba_2Cu_3O_y$) and $Tl_2CaBa_2Cu_2O_y$", Physica C, 156(4) pp. 592–598, 1988.

Adachi et al, "Superconducting Thin Films of Bi–Sr–Ca–Cu–O and Tl–Ba–Ca–Cu–O with Tc Above Look", Journal of Crystal Growth 91 (1988) Aug. II, No. 3, pp. 352–354.

Lysyak et al, "An Investigation of Thallium (I) Carboxylates by Thermal Analysis and Infrared Spectroscopy", Zh. Neorg. Khim (USSR) vol. 32, No. 3 Mar. 1987 pp. 573–577.

Nasu et al, "Formation of High–Tc Superconducting $BiSiCaCu_2O_x$ films on $ZrO_2/Si$ (100)", Jpn J. Appl. Phys. 27(4) Apr. 1988 L634–635.

Hamdi et al, "Formation of Thin–Film High Tc Superconductors by Metaorganic Deposition", Appl. Phys. Lett. 51(25) Dec. 1987 pp. 2152–2154.

Gross et al, "Versatile New Metalorganic Process for Preparing Superconducting Thin Films", Appl. Phys. Lett. 52(2) Jan. 1988 pp. 160–162.

Nasu et al, "Superconducting Y–Ba–Cu–O Films with Tc 770K Prepared by Thermal Decomposition Technique of Y–, Ba–, and Cu–2 ethylhexanoates" Chemistry Letters, Oct. 1987 pp. 2403–2407.

Lee et al, "Superconducting Tl–Ca–Ba–Cu–O Thin Films with Zero Resistance at Temperature of up to 120K", Appl. Phys. Lett. 53(4) Jul. 1988 pp. 329–331.

Primary Examiner—Roy V. King
Attorney, Agent, or Firm—Lyon & Lyon

[57] ABSTRACT

Novel articles are provided of thin super-conductive thallium-based copper oxide layers on inorganic, usually crystalline substrates. Novel methods are provided for ease of producing such articles, particularly involving sol-gel techniques and laser ablation. The articles have a highly oriented superconductive thallium-based copper oxide film, particularly epitaxial, with high superconductive transition temperatures and desirable electrical properties. The subject articles find use in a wide variety of electronic applications, particularly in microwave and millimeter wave devices.

15 Claims, No Drawings

EPITAXIAL THIN SUPERCONDUCTING THALLIUM-BASED COPPER OXIDE LAYERS

This is a continuation of co-pending application Ser. No. 07/852,352, filed Mar. 17, 1992, now abandoned, which is an FWC of Ser. No. 07/712,147, filed on Jun. 6, 1991, now abandoned, which is a continuation of Ser. No. 07/238,919, filed Aug. 31, 1988, now U.S. Pat. No. 5,071,830.

INTRODUCTION

1. Technical Field

The subject invention concerns the production of superconductor films on substrates and devices prepared with such structures.

2. Background

The recent scientific revolution in high temperature superconductivity has resulted in the discovery of many new metal oxide compounds, particularly copper oxide compounds, that exhibit this unique property. These discoveries have brought about a dramatic increase in the superconducting transition temperatures ($T_c$). The initial compounds were, for the most part, based on the combination of alkaline earth metals and rare earth metals, such as barium and yttrium in conjunction with copper. More recently, thallium based superconductors have been prepared, where the compositions have various stoichiometries of thallium, calcium, barium copper and oxygen. The thallium materials have been more difficult to process, since thallium is able to undergo a change in oxidation state to a composition which is liquid at processing temperatures. Thallium oxides have a relatively high vapor pressure and this has added to the difficulties in processing to ensure that the crystal structure has the correct stoichiometry. For the most part, sealed Au or Pt ampoules are used to control Tl volatilization by developing a controlled overpressure of Tl and oxygen above the film during high temperature processing.

Superconducting films are of great interest. However, in order to be useful, the films must be fairly uniform, be capable of carrying the current requirements of the device, have a superconducting transition temperature desirably substantially greater than the temperature of liquid nitrogen, have much lower surface resistance than copper, and be capable of reproducible preparation.

Relevant Literature

Ginley and co-workers at Sandia National Laboratories recently reported the preparation of superconducting thin films of the 2122 thallium compound ($Tl_2,Ca,Ba_2,Cu_2,O_8$) Jim Kwak at the same laboratory has reported polycrystalline thallium based films on yttria stabilized zirconia. Their films were prepared on yttria stablized zirconia substrates by sequential e-beam evaporation of the individual metals on the substrate, followed by a post deposition reaction step in a closed platinum crucible. The films that were obtained were unoriented and exhibited a transition temperature of 97 K. IBM has reported preparing oriented thin films of the 2223 and 2122 compounds by rf diode sputtering.

A large number of articles have been published concerned with the thallium compounds. Illustrative of these articles are Sheng and Hermann, *Nature*, (1988) 332:55–58; Sheng and Hermann, *Nature*, (1988) 332:138–139; Ginley et al, *Physica C*, (1988) 152:217–222; *Superconductor Week*, Vol. 2, No. 18, May, 9, 1988, reported that Sandia had reported that thallium unoriented polycrystalline thin films have reached critical current densities of 110,000 A/cm² with a $T_c$ at 97 K in the presence of a high magnetic field (6 Tesla).

Venkatesan et al, *Appl. Phys. Lett.* (1988) 52:1193–1195, and Wu et al, *Proceedings of SPIE Symposium on High $T_c$ Superconductors*, Newport Beach, Calif. March, 1988, report the use of pulsed laser deposition for preparation of high $T_c$ superconducting thin films. Venkatesan et al, and Wu et al, supra claim to have achieved YBaCuO films that are superconducting after deposition at 650° C., followed by oxygen annealing at 450° C. Witanachchi et al (*Appl. Phys. Lett.*, in press) report that with the addition of DC bias plasma during laser ablation of high $T_c$ superconducting YBaCuO thin films, in situ superconducting films can be achieved at substrate temperatures as low as 400° C.

SUMMARY OF THE INVENTION

Methods, compositions and devices are provided concerning thallium based superconducting films on a substrate. The methods provide for controlled formation of a thallium superconductive film on a substrate to provide components of electronic devices particularly for microwave and millimeter wave applications. Sol-gel and laser ablation techniques are exemplified, where with particular substrates, epitaxial growth can be achieved.

DESCRIPTION OF THE SPECIFIC EMBODIMENTS

Methods, compositions and devices are provided comprising a thin film thallium based superconductor composition. The compositions comprise thallium(calcium)$_x$-barium-copper oxide (x=0 or 1) films on a variety of substrates, particularly crystalline substrates. Methods which have been employed to produce the films are both chemical and physical deposition techniques and include sol-gel and laser ablation techniques as preferred. The superconductor layer coated substrates find use as components in a wide variety of electronic devices, particularly with microwave and millimeter wave applications.

The films which are provided are primarily thallium-calcium-barium-copper oxides, with a stoichiometry which may include 2021, 2122, 2223, or such other stoichiometries as may be employed. The films will be oriented films, so as to have a substantially uniform crystallinity. The films may be comprised of a single crystal or a plurality of crystals joined at their grain boundaries. The films will be highly oriented with the c-axis substantially normal to the surface of the substrate as demonstrated by X-ray analysis or electron beam channeling techniques. For the most part, single phase films will be obtained, although, as desired, mixes of two of the phases or related phases may be achieved within the film or polycrystalline films may be prepared.

The thickness of the film may be controlled, being a one layer thickness, where the layer includes all of the necessary planes to obtain superconductivity, generally from about 30–50 Å, or may be as thick as two microns or greater, depending upon the particular application. The thickness of the film is primarily of practical consideration, rather than a significant limitation as a result of the procedures employed.

For many uses, a fraction of a micron thickness will be employed. The film will have a superconducting transition temperature of at least 75 K., more usually 90 K., preferably at least about 100 K., more preferably about 115 K., and particularly preferred at least about 125 K., where the transition temperature has so far been substantially less than about 150 K. 2122 composition films can be achieved with a $T_c$ of at least 110 K. and 2223 fils with a $T_c$ of at least 125 K. The superconducting transition temperature should be as high as feasible, though in some situations one parameter may be compromised for another parameter.

The films will usually have critical current densities of at least about $10^3$ A/cm$^2$, usually at least about $10^6$ A/cm$^2$. For microwave and millimeter wave applications, the surface resistance or impedance will generally be less than about $10^{-3}\Omega$ more usually less than about $10^{-4}\Omega$, at 10 GHz and at a temperature above 50 K., preferably above 75 K.

The films will be substantially free of contaminants, having less than about 10 wt. %, preferably less than about 5 wt. % of material not involved with the superconducting crystal. For the most part, films will be at least about 0.5 mm as their smallest dimension and 3 mm or as large as 5 mm or more as their smallest dimension in the a.b plane.

The films will be of high quality as demonstrated by low lattice fault densities. By low lattice fault density is intended a sufficiently low fault density to demonstrate the intrinsic superconducting physical transport properties and sufficient to achieve required device property requirements. In addition, smooth surface morphologies can be achieved as well as uniform thickness.

Furthermore, the films may be grown epitaxially on substrates, where the crystal lattice of the superconductor does not differ by more than about 10%, usually not more than about 9% in lattice mismatch. That is, along the a-axis of the crystal, the difference in lattice parameter between their a axes ($a_{substrate} - a_{superconductor}/a_{substrate}$) may differ by up to about 10% and still obtain epitaxial growth. Epitaxy is desirable but is not required to obtain highly oriented c-axis films. However, in addition to being highly oriented, one may also achieve epitaxy by appropriate choice of substrate.

Epitaxial Tl 2223 and 2122 films on {100} surfaces of MgO having intentional deviations of a few degrees from nominal orientation on axis can be beneficial. In a Tl 2223 film the <001> axis (lattice parameter, c=36.26 A) is substantially coincident with the <001> axis of the MgO substrate or is at a systematic angular deviation in epitaxy with large lattice mismatches. Besides the parallel <001> axes, the epitaxial Tl film has its <100> and <010> axes parallel or at a systematic deviation to the analogous axes of the MgO substrate.

Various substrates including polycrystalline substrates may be employed, depending upon the particular use for the coated substrate, whether one wishes epitaxy, the particular processing conditions, and the like. Substrates which may find use include magnesium oxide, yttrium stabilized zirconia, sapphire, alumina, silicon, lanthanum aluminate, strontium titanate, gallium arsenide, calcium fluoride.

Various techniques may be employed for producing thallium based superconductors on a solid substrate. Techniques which have been employed in the past with other superconductor metal oxide compositions include laser ablation, thermal evaporation, liquid phase epitaxy, electron beam, evaporation beam or magnetron sputtering, and chemical vapor deposition. Illustrative of methods for producing the subject layers are liquid phase epitaxial coating as exemplified by sol-gel coating and laser ablation.

Liquid phase epitaxial film formation involves a liquid coat on a substrate, where the metal oxides crystallize onto the substrate. A liquid composition can be formed with thallous oxide as the solvent with the other oxides dissolved in the thallous oxide at an elevated temperature and with the correct stoichiometry. Upon cooling, the metal oxides will crystallize to form an epitaxial layer. One need not use the oxides initially, but can use metal compounds which may serve as the source of the metals in the liquid phase, where the counterions and conditions results in the formation of the desired oxide.

The liquid phase epitaxial procedure employs highly polished surfaces of the substrate. The surface may be polished mechanically or chemically, preferably chemically. Single crystal substrates are necessary to obtain epitaxial film structures. For example, single crystal magnesium oxide <100> may be polished using hot concentrated phosphoric acid by e.g. about 80 C with 85% phosphoric acid for 10 min or by lapping the surface flat and to the desired orientation and then immersing in conc. phosphoric acid at 50 C for 1–3 min. The resulting crystal surface should be very clean, and provide a substantially defect free surface. The particular manner in which the surface is polished is not critical to this invention. Desirably, as exemplary of magnesium oxide, the (100) plane surface will be employed.

A gel composition is prepared employing metal soaps providing for the correct stoichiometry. The soaps will be carboxylates of at least about 6 carbon atoms, preferably at least about 8 carbon atoms, and usually not more than 16 carbon atoms, more usually not more than 12 carbon atoms. Conveniently, the 2-ethylhexanoates have found use, although neodecanoates, or other branched chain, particularly alpha-branched chain fatty acid may be employed. The metal soaps are prepared in accordance with conventional procedures. The soaps are dispersed in an appropriate medium, particularly hydrocarbons or halohydrocarbons boiling in the range of about 40 C to 100 C, such as chloroform, toluene, xylene, benzene, methylene dichloride, etc., and the mixture made homogeneous by agitation, for example shaking, for several hours. Adjuvants may be added, such as thickeners, e.g. polysaccharides. The resulting solution is then coated onto the substrate. Coating can be achieved by putting the viscous solution onto the surface to be coated and spinning the surface by centrifugation for a short time to ensure the substantially uniform distribution of the film. Alternatively, the substrate may be dipped into the solution, protecting those areas of the substrate which are not to be coated. Any technique which allows for substantially uniform coating of the film may be employed.

The coated substrate is then pyrolyzed for a short time at an elevated temperature, generally in the range of about 150° C. to 500° C., preferably in the range of about 150° C. to 300° C. Tl volatilization can occur at temperatures as low as 100° C., so that Tl overpressures and oxidizing atmospheres are employed to control phase formation and to limit Tl loss and formation of undesired second phases in the film. The pyrolysis time and temperature should be selected to substantially ensure the complete decomposition of the fatty acids, so as to leave a thin film of metal oxides, the pyrolysis occurring in the presence of oxygen, conveniently air. The procedure may be repeated as many times as desired, in order to enhance the thickness of the metal oxide film. Desirably, the subsequent pyrolyses, may be carried out at a lower temperature than the initial pyrolysis, where the initial pyrolysis is carried out in the upper portion of the temperature range, e.g., 250°–450° C., and the subsequent pyrolyses are carried out at a temperature in the range of about 200°–350° C. Usually, at least about 60% of the volatile organic material is removed and by extending the heating period, a constant weight can be realized. Care must be taken to minimize thallium volatilization when pyrolysing above 300 C. The film forming will be carried out at least once, more usually twice, and may be five times or more, usually not more than about four times.

The thickness of the layer will depend upon a number of parameters: the viscosity of the gel, the time for spinning, the revolutions per minute, the temperature at which the substrate is spun, and the like. Where other techniques are used to provide the coating, such as dipping, spraying, spreading with a blade, or the like, different parameters may be involved.

Once the substrate surface has been coated to the desired degree, the substrate may then be introduced into a closed inert vessel, containing pellets with the appropriate molar ratio maintaining the stoichiometry of the film in the presence of a source of oxygen. The molar ratio for the pellets is determined by the phase that is desired within the film. Other factors that affect the film composition include the geometry and temperature of the source material and the Tl overpressure.

Conveniently, air, pure oxygen, or other source of oxidizing oxygen may be employed, e.g., hydrogen peroxide or ozone. The pellet composition will vary depending upon the particular thallium superconductor one wishes to prepare. For example, for the 2223 composition, the pellets will have a Tl: Ca: Ba: Cu 1:3:1:3 molar ratio. The inert tube is conveniently a passivated noble metal, most conveniently gold or plated quartz, which may be externally reinforced to support the pressures during the reactions.

The temperature will be at least about 600° C, more usually at least about 630° C., and not more than about 950° C., frequently in the range of about 800°–900° C. The temperature may be monitored in any convenient way, conveniently a thermocouple. Usually, the temperature will be achieved rapidly, generally under five minutes, preferably under three minutes, more usually from about 0.5–3 minutes. Slower heating rates (20 C/min) may be employed to give continuous superconducting films of smaller grain size. The tube may then be heated at a temperature or temperatures in the range indicated above, generally for sufficient time to ensure complete pyrolysis of any residual carbon compounds and allow for the atoms to assume the proper lattice structure. Generally, the time will be at least about three minutes and not more than about 60 minutes, more usually in the range from about two to 25 minutes, preferably from about two to ten minutes. At the end of this time, the tube may be removed from the heating Source and allowed to cool. Normally, there need not be any effort at rapid quenching, so that the tube may be allowed to sit at room temperature, without providing for a rapid reduction in temperature.

A second preferred procedure for preparing the subject films employs laser ablation. In accordance with this invention, laser ablation is achieved by preparing an appropriate target. The apparatus for the most part, is conventional and is described in Wu et al, supra. A target is prepared by placing the appropriate composition of metals or metal oxides on the surface of a support which can be rotated at a controlled rate. The target on its support is placed in a vacuum chamber having a quartz window, where a laser beam of appropriate energy and wave length impinges on the target causing a plume of ablated vapor normal to the target surface. The substrate is placed substantially normal to the direction of the plume, so as to receive the atoms in the plume, where the atoms bind to the surface of the substrate. The substrate is normally maintained at an elevated temperature during the deposition.

The laser ablation target can conveniently be made in the same manner as the sol-gel coating in the pyrolysis technique. Thus, a uniform film of the various carboxylates can be prepared and pyrolyzed as described previously to produce the desired oxide mixture. Pyrolysis can be carried out in the presence of oxygen, so as to ensure the formation of the desired metal oxides in their proper oxidation state.

The laser energy will generally be from about 1–3 $J/cm^2$. The film on the target will have the same composition so far as metal molar ratio as the intended composition on the substrate. The target will usually be of from about 0.5 to 10 in.$^2$ in surface area and about 0.001 to 0.10 in. thickness.

The laser may be focussed to cover various areas. Usually, the laser may impinge upon the surface over a wide range of angles from a minimum of about 2° up to 90°. A typical impingement angle is about 25°. The area impinged by the laser will generally be at least about 2 $mm^2$ and not more than about 50 $mm^2$. A typical area is about 15 $mm^2$. The ratio of length to width will depend upon the angle of impingement, and will generally be at least 2 to 1, and not more than about 20 to 1, more usually not more than about 10 to 1. By employing an energy in the range of about 2 $J/cm^2$ per pulse, one can deposit about one monolayer, generally about 3 Å thick with each pulse. By controlling the number of pulses per second, which would generally range from about 0.5 to 50, one can achieve an accretion on the substrate of about 0.1 $\mu m/min$.

The target will usually be relatively close to the substrate, usually not less than about 2 cm and not more than about 5 cm, preferably about 3 cm. The chamber will be evacuated to under 300 mTorr, preferably from about 2 to 100 mTorr, more preferably about 2 to 20 mTorr. Various inorganic oxidizing gases may be present, such as oxygen, air, hydrogen peroxide, ozone, nitrogen oxides, such as nitrous oxide and nitric oxide, or the like, where the inorganic oxygen source can be activated by virtue of the laser beam or an independent energy source. For example, an oxidizing gas source may be directed toward the layer in the substrate where the gas has been activated, for example, oxygen activated by passing through an electric field or laser.

The substrate will generally be maintained at a temperature in the range of about 450°–750° C., preferably about 500°–650° C. The temperatures which are maintained will allow for the atoms to form the proper crystal structure, but should be kept as low as possible to minimize interdiffusion between the film and substrate and to minimize thallium loss by vaporization. The lower the temperature which is used for the substrate, the slower the deposition rate which should be employed. Alternatively, one can increase the energy of the atoms and molecules in the plume by providing for a plasma in the ablated plume. This additional energy increases the atoms' ability to form the proper crystal structure at low temperature, and increases the rate at which the film may be grown.

In some instances, where thallium may be lost because of its higher vapor pressure, it may be desirable to increase the amount of thallium in the target. Alternatively, thallium loss can be minimized by maintaining a higher oxidation potential in the apparatus.

It may be desirable to sequentially ablate one or a combination of metals or metal oxides, so that layers of different composition are deposited sequentially to provide the different atomic layers of the crystal.

The subject device components can be used in a wide variety of devices. Because superconductive layers have low microwave surface impedance, they find use in numerous microwave and millimeter wave applications. The subject elements comprising the substrate and film, by appropriate choice of substrates, may find use in radio frequency cavities and resonators, microwave shielding, antennas, in transmission lines, employing different structures, such as coaxial, microstrip, coplanar wave guide, coplanar strip line, inverted or suspended microstrip, and the like. The devices find use in signal communications or delays, filters, resonators and oscillators, circuit interconnections, power combiners, and antenna feeds.

For a narrowband microwave filter with superconducting resonator elements, the specifications could be:

Transmission medium: microstrip coupled lines (5–15 resonator elements)
Bandwidth: 0.1–10% at the center frequency ($f_o$)
Dimensions:
S:C thickness (t)=1 micron
$\epsilon_r$=9.65 (MgO)
Loss tangent=0.0002 (MgO)
Substrate height (h)=25 mils
Spacing (s)=10–150 mils
Line width (w)=1–40 mils
Length (l)=0.25 guide wavelength at $f_o$
l=114 mils at 10GHz
Package dimensions:
X=1 in.
Y-1 in.
Z=0.25 in.

The filter is packaged in a shielded case and cooled to 77° K. and connected with an SMA coaxial connector to other hardware part.

Delay lines are an integral part of a digital instantaneous frequency measurement (DIFM) component.

The specifications could be as follows:
Dimensions:
Superconductor thickness (t)=145 Å
$\epsilon_r$=9.65 (MgO)
Loss tangent=0.0002 (MgO)
Substrate height (h)=100$\mu$–25 mils
Line width (w)=1–5$\mu$
Total length (l)=20 cm
Package dimensions:
X=1 in.
Y=1 in.
Z=0.25 in.

The delay line can be packaged in a shielded case thermally attached to a 77° K. cold finger with SMA coaxial connectors interconnecting the delay line within the DIFM.

The following examples are offered by way of illustration and not by way of limitation.

EXPERIMENTAL

The individual metal carboxylates compounds were prepared following established procedures. The resulting solutions of metal soap compounds in chloroform were reduced in volume by analyzed by atomic absorption for their metal contents. These precursor solutions were then used to prepare the precursor sol by combining 5g copper 2-ethylhexanoate, 3.29 g barium 2-ethylhexanoate, 3.14 g calcium 2-ethylhexanoate, and 8.462 g thallium 2-ethylhexanoate in 5 ml of chloroform. The precursor stoichiometry was $Tl_2Ca_2Ba_2Cu_3$. The solution was mixed by shaking for several hours. This precursor solution was spun onto a single crystal yttria-stabilized zirconia (<100> orientation) substrate at 400 rpm for 30 sec followed by pyrolysis at 400° C. for 5 min. This spin/pyrolysis procedure was repeated twice more at 250° C. Oxide pellets with a molar ratio Tl:Ca:Ba:Cu-1:3:1:3 prepared by mixing the individual oxides together by griding and then pressing uniaxially in a Carver press. The pellets and the coated substrate were placed in air in a ¼" diameter gold tube and hermetically sealed. The sealed gold tube was attached to a thermocoupled probe using wire and inserted into a preheated tube furnace. The material was brought to a temperature of 855° C. in 2 min and held for 10 min. The sample was then removed from the furnace and cooled to room temperature. The entire film processing procedure required about 15 min to complete.

Optical micrographs of the pyrolyzed film revealed the presence of a large number of plate and needle-like (plate on edge) structures throughout the film. Both structures were found to have, by chemical analysis, the 2223 composition. Scanning election microscopy of the film showed the plate-like morphology of the superconducting 2223 compound. The micrograph also showed the spherical Ca/Tl oxide deposits that inhabit regions immediately adjacent to the plate-like structures. The composition of the plate was determined by SEM-EDX (scanning electron microscopy energy dispersion x-ray spectroscopy) to consist of 12.1 atomic percent Ba, 12.2 Tl, 11.9 Ca and 19.8 Cu. The compositional analysis results were consistent from area to area and are consistent with the material possessing a 2223 metal stoichiometry. The highly oriented nature of the 2223 film is indicated by the large enhancement of the <001> reflections. A minor peak at 6° was indicative of a very small amount of the 2122 phase in the film. The temperature dependent magnetic susceptibility measurement was performed on the film on the assumption that the material consisted of a 2 micron thick fully dense film. It was calculated that greater than 60% of the material became superconductive.

To prepare the 2122 composition, the above procedure was repeated, except the composition of the source material corresponded to a Tl:Ca:Ba:Cu atomic ratio of 2:2:2:3. The temperature was slightly modified to 860° C. for reaction and the substrate which was employed was a magnesium oxide substrate single crystal that had been chemically polished using hot concentrated phosphoric acid as described previously (See Sanywal and Sutaria, J. Mater. Sci. (1976) 11:2271–2282) to provide a substantially defect free (<100>) surface.

Optical micrographs of the pyrolyzed film revealed the presence of a large number of plate-like structures throughout the film. These structures were found by SEM-EDX to have a chemical composition corresponding to the 2122 material. SEM of the film clearly showed the plate-like morphology of the superconducting 2122 compound. The film was highly c-oriented as indicated by highly enhanced <00L> reflections. The film was found to be epitaxial by comparing electron channeling patterns of the single crystal substrate with that of the film in various regions. The morphology of the film is Strongly indicative of the presence of an intermediate liquid phase during processing. The surface of the film (which resembles thin film surfaces obtained by liquid phase epitaxial growth techniques), was analyzed by EDX to have the correct cation stoichiometry for the 2122 compound.

Electron beam channeling patterns were obtained from many representative areas within the film. Electron channeling patterns of the film revealed that the orientation of the a, b plane within the 2122 film was identical to that of the substrate in many areas throughout the film. In a few areas, the channeling pattern of the film was slightly misoriented (by a constant amount) from the substrate, perhaps indicative of a buildup of strain or dislocations at the film/substrate interface due to lattice mismatch which is approximately 9%. The lattice registry with the surface was maintained not only at layers close to the magnesium oxide substrate, but also at the top of plates many microns from the substrate surface.

To deposit a thallium-based superconducting film, for example of the 2223 composition, a substrate is loaded into a specially designed vacuum chamber, and held in position where it faces a target approximately 3 cm away. The vacuum chamber is evacuated to a pressure of less than $1 \times 10^{-6}$ torr, then back filled to $5 \times 10^{-3}$ torr with oxygen, while the substrate is heated to a temperature between 400° and 600° C. Material is then vapor transported from the target to the substrate by laser ablation, using a laser energy density on the target of 1.5 to 2.0 Joules/cm$^2$. The laser is pulsed at 5 Hz for 5 to 10 minutes, depositing a film 0.5 to 1.0 μm thick. After ablation the film is cooled to room temperature and the substrate removed from the vacuum chamber.

The film thus deposited is continuous and smooth over the entire substrate. In some locations there are particles on the film surface that appear to have been transported form the target either in solid particle form or as small melted globules. The film composition, measured by energy dispersive x-ray spectroscopy, is found to be the same as the target composition for substrate temperatures up to 400° C. Thus if the target has the 2223 composition, the film has the same composition. When the substrate temperature is 600° C., the maximum content of the film is lower than that of the substrate because the film loses thallium by evaporation. The loss can be compensated by increasing the thallium content of the target.

The films are not superconducting as deposited, but become superconducting after annealing at 750°–850° C. in a sealed gold pouch containing a source of thallium vapor.

Advantages of the laser ablation method include the cleanliness inherent in vacuum deposition, precise and repeatable control of the rate of film growth, control of film stoichiometry via the target composition, control of oxygen activity via the choice of oxygen species and/or plasma activation, and the ability to grow on a substrate at elevated temperature to encourage epitaxial growth.

The subject articles comprising superconductive thallium-based layers on crystalline substrates provide for an extraordinary advance over previously prepared materials. The subject articles have superconductive properties at liquid nitrogen or higher temperatures, are highly oriented and in many instances are grown epitaxially on a crystalline substrate and as shown, provide for a number of highly desirable physical and electrical properties.

In addition, novel methods have been provided for producing the subject compositions, where growth can be carefully controlled, so as to provide for highly oriented and epitaxial films. In addition, the thickness can be controlled, so as to provide for greater homogeneity and uniformity of the sol-gel film. Also, the rate of growth of the crystallites is controlled under controlled temperature conditions, to provide for substantial homogeneity.

Advantages of the sol-gel technique include the capability to coat large areas uniformly, atomic-scale mixing of the components at room temperature, low temperature synthesis of mixed metal oxides, amenability to powder, bulk, film or fiber development as well as attaining of high chemical purities.

The laser ablation system has the advantages of safety, the system is opened at room temperature, the superconducting Tl films are formed in situ, and the ablation and condensation zone may be surrounded by disposable shields, where stray thallium will deposit, rate of growth and thickness can be carefully controlled, and epitaxial growth can be encouraged.

All publications and patent applications mentioned in this specification are indicative of the level of skill of those skilled in the art to which this invention pertains. All publications and patent applications are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A superconducting article comprising an oriented, epitaxial superconducting layer of thallium, optionally calcium, barium and copper oxide on a crystalline substrate, said layer being at least 30 Å thick, and having a c-axis oriented normal to the crystalline substrate surface and being epitaxial to the substrate in that the a and b axes of the layer are at a fixed relationship to the substrate.

2. A superconducting article according to claim 1, wherein said superconducting layer has the 2122 composition.

3. A superconducting article according to claim 1, wherein said superconducting layer has the 2223 composition.

4. A superconducting article according to claim 1, wherein said substrate is magnesium oxide or yttria stabilized zirconia.

5. A microwave or millimeter device comprising an article according to any of claims 1, 2, 3 and 4.

6. The superconducting article of claim 1 wherein the layer thickness is less than or equal to 2 microns.

7. The superconducting article of claim 1 wherein the crystalline substrate consists of a single crystal.

8. The superconducting article of claim 1 wherein the substrate is lanthanum aluminate or sapphire.

9. The superconducting article of claim 1 wherein the epitaxial superconductor measures at least 3 millimeters in the smallest dimension in the a and b directions of the layer.

10. The superconducting article of claim 9 wherein the epitaxial superconducting layer measures at least 5 millimeters in the smallest dimension in the a and b axes of the layer.

11. The microwave or millimeter device of claim 5 wherein the device includes a resonator.

12. The microwave or millimeter device of claim 5 wherein the device includes a delay line.

13. The superconducting article of claim 1 wherein the surface resistance is less than or equal to $10^{-3}$ ohms at 10 GHz at 77 K.

14. The superconducting article of claim 13 wherein the surface resistance is less than or equal to $10^{-4}$ ohms at 10 Ghz at 77 K.

15. The superconducting article of claim 1 wherein the epitaxial superconductor measures at least 0.5 millimeters in the smallest dimension in the a and b directions of the layer.

* * * * *